(12) United States Patent
Kunii et al.

(10) Patent No.: US 7,811,007 B2
(45) Date of Patent: Oct. 12, 2010

(54) SINGLE-FIBER BIDIRECTIONAL OPTICAL TRANSMITTER/RECEIVER

(75) Inventors: Masaki Kunii, Kawasaki (JP); Kazuya Sasaki, Kawasaki (JP); Shinichi Sakuramoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/382,488

(22) Filed: Mar. 17, 2009

(65) Prior Publication Data

US 2009/0324238 A1   Dec. 31, 2009

(30) Foreign Application Priority Data

Jun. 26, 2008   (JP) .............................. 2008-167393

(51) Int. Cl.
*G02B 6/36*   (2006.01)
(52) U.S. Cl. .......................................... 385/92; 385/88
(58) Field of Classification Search ................ 385/14, 385/15, 31, 49, 92, 135, 88
See application file for complete search history.

(56) References Cited

U.S. PATENT DOCUMENTS 7,260,285 B2 *   8/2007   Mitamura et al. ............. 385/14
2007/0031091 A1 *   2/2007   Mitamura et al. ............. 385/88

FOREIGN PATENT DOCUMENTS

JP   2006-294746   10/2006

* cited by examiner

*Primary Examiner*—Charlie Peng
*Assistant Examiner*—Mary A El Shammaa
(74) *Attorney, Agent, or Firm*—Staas & Halsey LLP

(57) ABSTRACT

A single-fiber bidirectional optical transmitter/receiver includes a single-fiber bidirectional optical transmission/reception device. A circuit board has a signal processing circuit and a drive circuit configured to drive the single-fiber bidirectional optical transmission/reception device. A main housing accommodates the single-fiber bidirectional optical transmission/reception device and the circuit board. A ground part of a reception side of the single-fiber bidirectional optical transmission/reception device is electrically connected to a ground part of a transmission side of the single-fiber bidirectional optical transmission/reception device through a ground wiring pattern formed on a flexible printed board.

10 Claims, 9 Drawing Sheets

SINGLE-FIBER BIDIRECTIONAL OPTICAL TRANSMITTER/RECEIVER

CROSS-REFERENCE TO RELATED APPLICATIONS

This application is based upon and claims the benefit of priority of the prior Japanese Patent Application No. 2008-167393, filed on Jun. 26, 2008, the entire contents of which are incorporated herein by reference.

FIELD

The embodiment discussed herein is directed to a single-fiber bidirectional optical transmitter/receiver that transmits and receives optical signals through a single optical fiber.

BACKGROUND

In the field of optical communication, communication systems are used in which optical signals are transmitted bidirectionally through a single optical fiber. In such a communication system, there are many cases where transmission and reception of optical signals are performed using a single-fiber bidirectional optical transmitter/receiver.

The single-fiber bidirectional optical transmitter/receiver has a single-fiber bidirectional optical transmission/reception device that is formed by a laser diode (LD) for optical transmission and a photo diode (PD) for optical reception being incorporated into a single housing (for example, refer to Patent Document 1).

FIG. 1 is a perspective view of an interior of a main housing of a single-fiber bidirectional transmitter/receiver. In many cases, the main housing 2 of the single-fiber bidirectional transmitter/receiver is formed of a steel plate of which surface is zinc-plated or nickel-plated. A single-fiber bidirectional optical transmission/reception device 4 and a circuit board 12 are accommodated in the main housing 2.

The single-fiber bibidirectional optical transmission/reception device 4 is a device including a laser diode (LD) for optical transmission and a photo diode (PD) for optical reception that are incorporated into a single housing to be integrated with each other. An avalanche photo diode (APD) is used in many cases as a photo diode (PD) for optical reception. The single-fiber bidirectional optical transmission/reception device 4 includes a connector part 6 to which an optical fiber is connected, an LD stem part 8 into which a laser diode is incorporated, and a PD stem part 10 into which a photo diode is incorporated.

An optical fiber (not shown in the figure) is connected to the connector part 6. An optical signal transmitted through the optical fiber is changed into an electric signal by the photo diode of the PD stem part 8, and is output from the PD stem part 8. A lead-terminal 8a for the photo diode extends from the PD stem part 8. The lead-terminal 8a is connected to an electrode terminal 12a of the circuit board 12. On the other hand, an electric signal for optical communication is changed into an optical signal by the laser diode of the LD stem part 10, and is transmitted to the optical fiber. A lead-terminal 10a for the laser diode extends from the LD stem part 10. The lead-terminal 10a is connected to an electrode terminal 12b of the circuit board 12.

Formed on the circuit board 12 are a drive circuit for driving the single-fiber bidirectional optical transmitter/receiver device 4 and a process circuit for processing electric signals supplied to the bidirectional optical transmitter/receiver device 4 and electric signals output from the single-fiber bidirectional optical transmission/reception device 4.

Patent Document 1: Japanese Laid-Open Patent Application No. 2006-294746

In the single-fiber bidirectional optical transmitter/receiver having the structure illustrated in FIG. 1, a voltage of an electric signal for driving the laser diode is a relatively high-voltage, which is about 1 V. Thus, a large drive current is supplied from the circuit board 12 to the LD stem part 10 through the lead-terminal 10a. On the other hand, a voltage of an electric signal output from the photo diode of the PD stem part 8 through the lead-terminal 8a is about several millivolts to several microvolts. Thus, an output current output from the PD stem part 8 through the lead-terminal 8a is also a very small current.

Because the lead-terminal 10a of the LD stem part 10 and the lead-terminal 8a of the PD stem part 8 are close to each other, it is possible that a cross-talk is generated electrically or electromagnetically between the lead-terminal 10a through which the large drive current flows and the lead-terminal 8a through which the very small current flows. If such a cross-talk occurs, a noise may be applied to the output signal output from the photo diode to the circuit board 12 through the lead-terminal 8a.

Additionally, in the single-fiber bidirectional optical transmitter/receiver having the structure illustrated in FIG. 1, the metal-made main housing 2 and the housing of the single-fiber bidirectional optical transmission/reception device 4 are caused to be a ground potential by being electrically connected to a signal grounding part (signal-ground: SG) of the circuit board 12. However, if an electrostatic discharge (ESD) occurs to the metal-made main housing 2 of the single-fiber bidirectional optical transmitter/receiver, there may be a case where an electric discharge is applied to the SG of the circuit board 12. In such a case, a noise enters a signal processing circuit formed on the circuit board 12, which may generate an SNR error (signal/noise ratio error). Additionally, a large current generated by the electrostatic discharge (ESD) flows to the housing of the single-fiber bidirectional optical transmission/reception device 4, which may cause a damage of electronic parts in the single-fiber bidirectional optical transmission/reception device 4 due to destruction by electrostatic discharge.

SUMMARY

According to an aspect of the invention, a single-fiber bidirectional optical transmitter/receiver includes: a single-fiber bidirectional optical transmission/reception device; a circuit board having a signal processing circuit and a drive circuit configured to drive the single-fiber bidirectional optical transmission/reception device; and a main housing accommodating the single-fiber bidirectional optical transmission/reception device and the circuit board, wherein a ground part of a reception side of the single-fiber bidirectional optical transmission/reception device is electrically connected to a ground part of a transmission side of the single-fiber bidirectional optical transmission/reception device through a ground wiring pattern formed on a flexible printed board.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

DESCRIPTION OF EMBODIMENT(S)

Preferred embodiment of the present invention will be explained with reference to the accompanying drawings.

Figure 1:
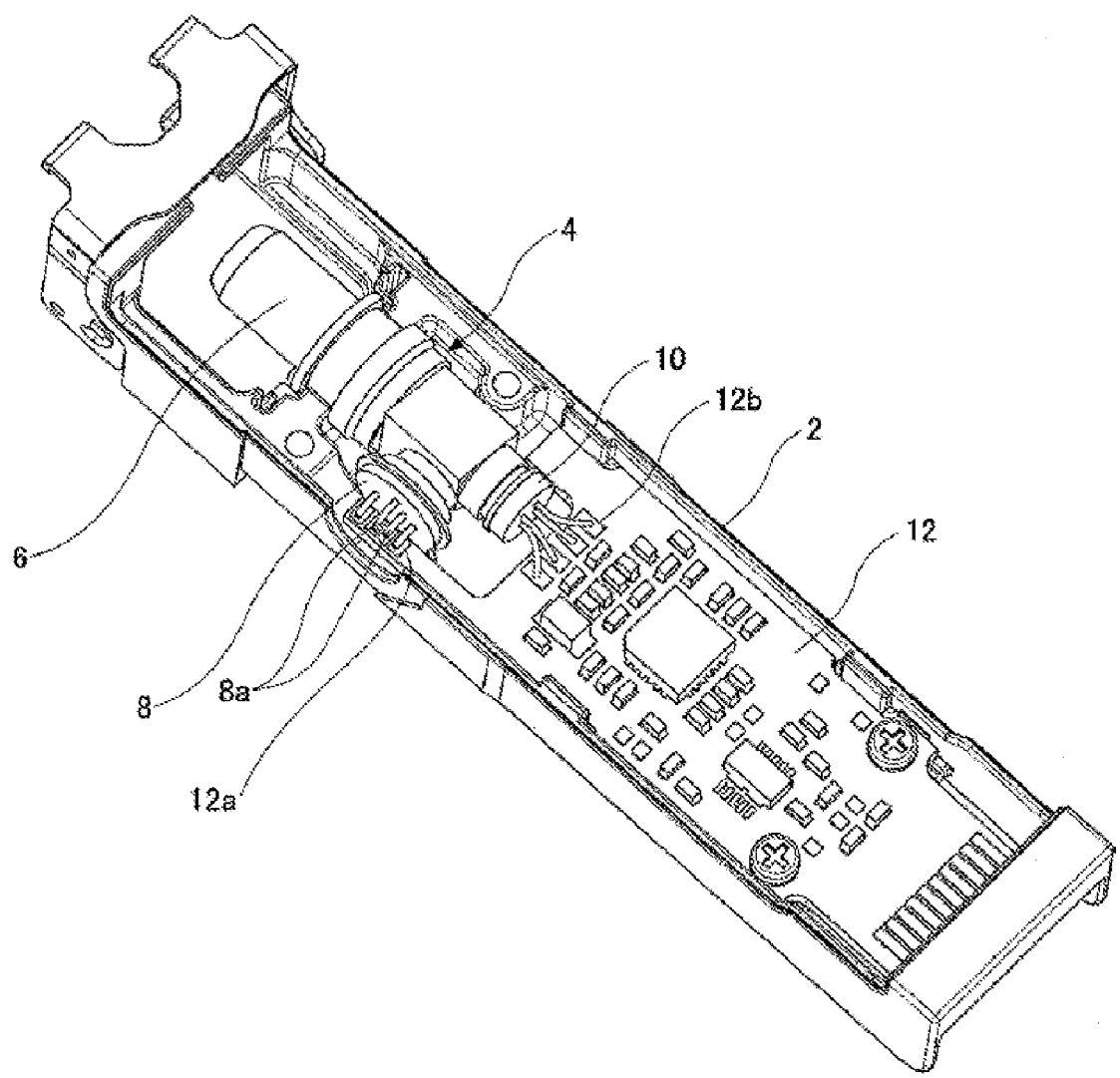
FIG. 1 is a perspective view of an interior of a housing of a single-fiber bidirectional optical transmitter/receiver.
Figure 2:
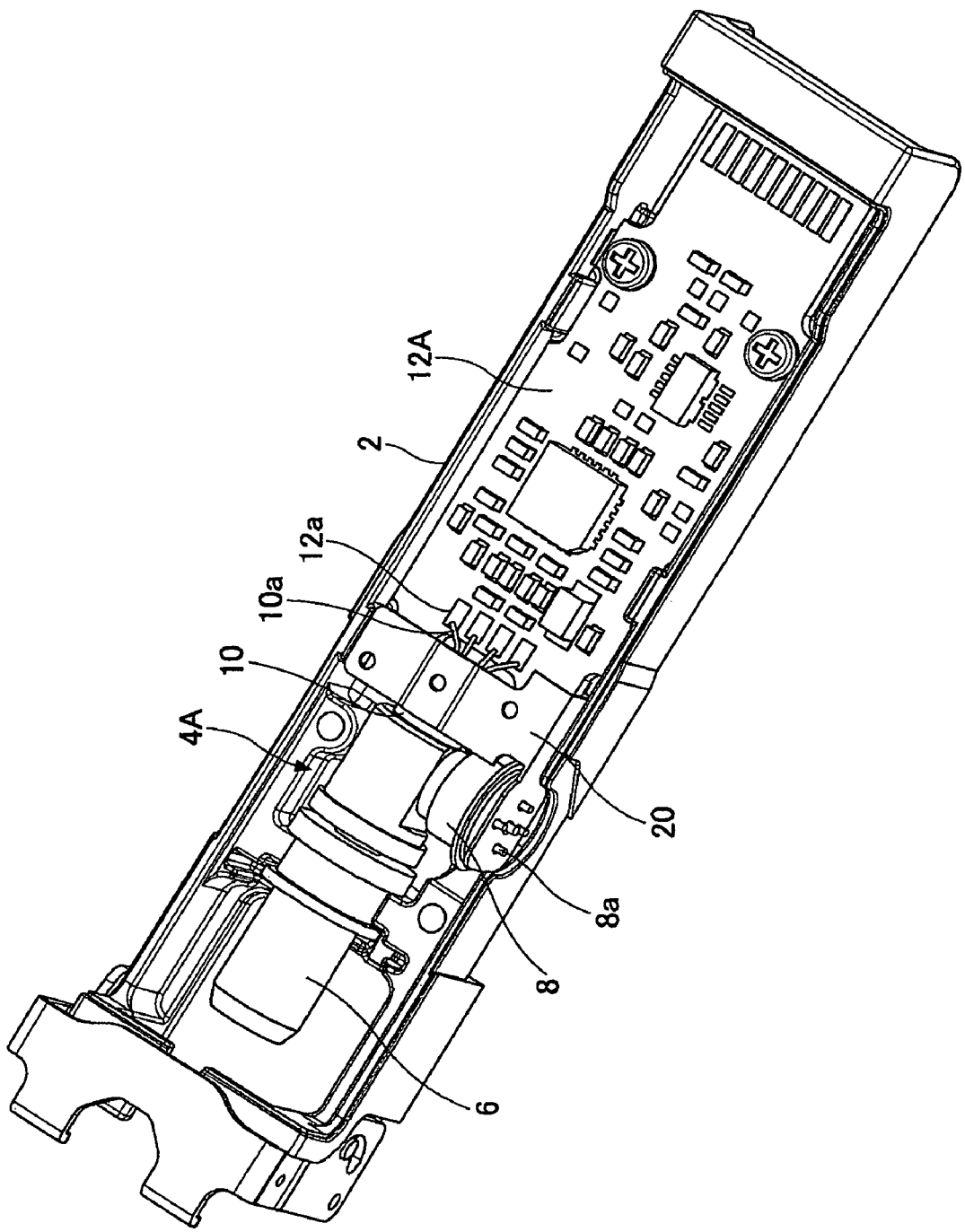
FIG. 2 is a perspective view of an interior of a housing of a single-fiber bidirectional optical transmitter/receiver according to an embodiment.

FIG. 2 is a perspective view illustrating an interior of a main housing of a single-fiber bidirectional optical-transmitter/receiver according to an embodiment. In FIG. 2, parts that are the same as the parts illustrated in FIG. 1 are given the same reference numerals.

In FIG. 2, a single-fiber bidirectional optical transmission/reception device 4A and a circuit board 12A are accommodated in the main housing 2. Although the single-fiber bidirectional optical transmission/reception device 4A has the same function as the single-fiber bidirectional optical transmission/reception device 4 illustrated in FIG. 1, the single-fiber bidirectional optical transmission/reception device 4A differs from the single-fiber bidirectional optical transmission/reception device 4 in that the connector part 6 is electrically separated from the PD stem part 8 and the LD stem part 10. A structure of the single-fiber bidirectional optical transmission/reception device 4A will be explained later. The circuit board 12A differs from the circuit board 12 illustrated in FIG. 1 in that only a circuit of the transmission side (circuit associated with the laser diode) is formed on a front surface (Ln plane) of the circuit bard 12A and only a circuit of the reception side (circuit associated with the photo diode) is formed on a back surface (L1 plane) of the circuit bard 12A.

In the present embodiment, lead-terminals 8a extending from the PD stem part 8 of the single-fiber bidirectional optical transmission/reception device 4A are connected to electrode terminals of the circuit board 12A through a flexible printed board (FPC) 20.

In the example illustrated in FIG. 1, the lead-terminals 8a, which extend from the PD stem part 8, extend to the electrode terminals 12a formed on the front surface (Ln plane) of the circuit board 12, and are connected to the electrode terminals 12a, respectively. Accordingly, the length of each lead-terminal 8a must be at least a length corresponding to a distance from the PD stem part 8 to the corresponding electrode terminal 12a. In the example illustrated in FIG. 1, this length is about 3 mm.

On the other hand, in the present embodiment, the lead-terminals 8a are connected to the electrode terminals 12a formed on the back surface (L1 plane) of the circuit board 12A through the FPC 20 (refer to FIG. 7 mentioned later). Accordingly, in the present embodiment, the lead-terminals 8a can be a length connectable to the FPC 20, and can be about 0.7 mm as a length solderable by penetrating through holes of the FPC 20. That is, in the present embodiment, the photo diode of the reception side is connected to the circuit board 12A through the very short lead-terminals 8a and wirings formed in the FPC 20.

Because signal wirings formed in the FPC 20 can be impedance-matched wirings, a portion to which a noise can easily enter is only a portion corresponding to the short lead-terminals 8a. That is, the length of the portion to which a noise can easily enter is about 0.7 mm in the present embodiment, while the lead-terminals 8a of the example illustrated in FIG. 1 require at least a length of about 3 mm and a noise can easily enter the portion corresponding to the length of 3 mm of the lead-terminals 8a. Thus, the portion to which a noise can easily enter is very much shorter in the present embodiment than that of the example illustrated in FIG. 1.

Figure 3:
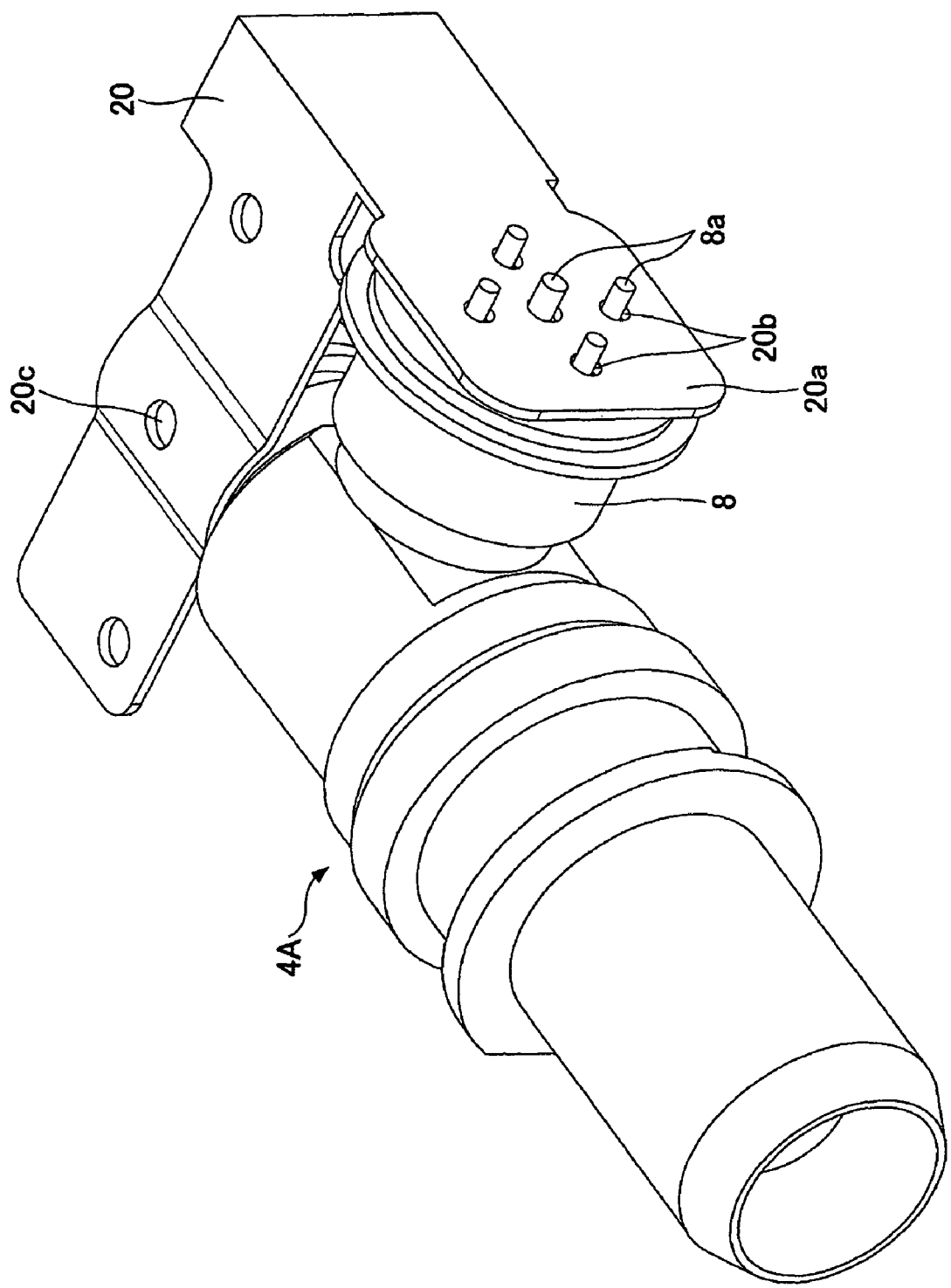
FIG. 3 is an enlarged perspective view illustrating a state where an FPC is attached to a single-fiber bidirectional optical transmission/reception device.
Figure 4:
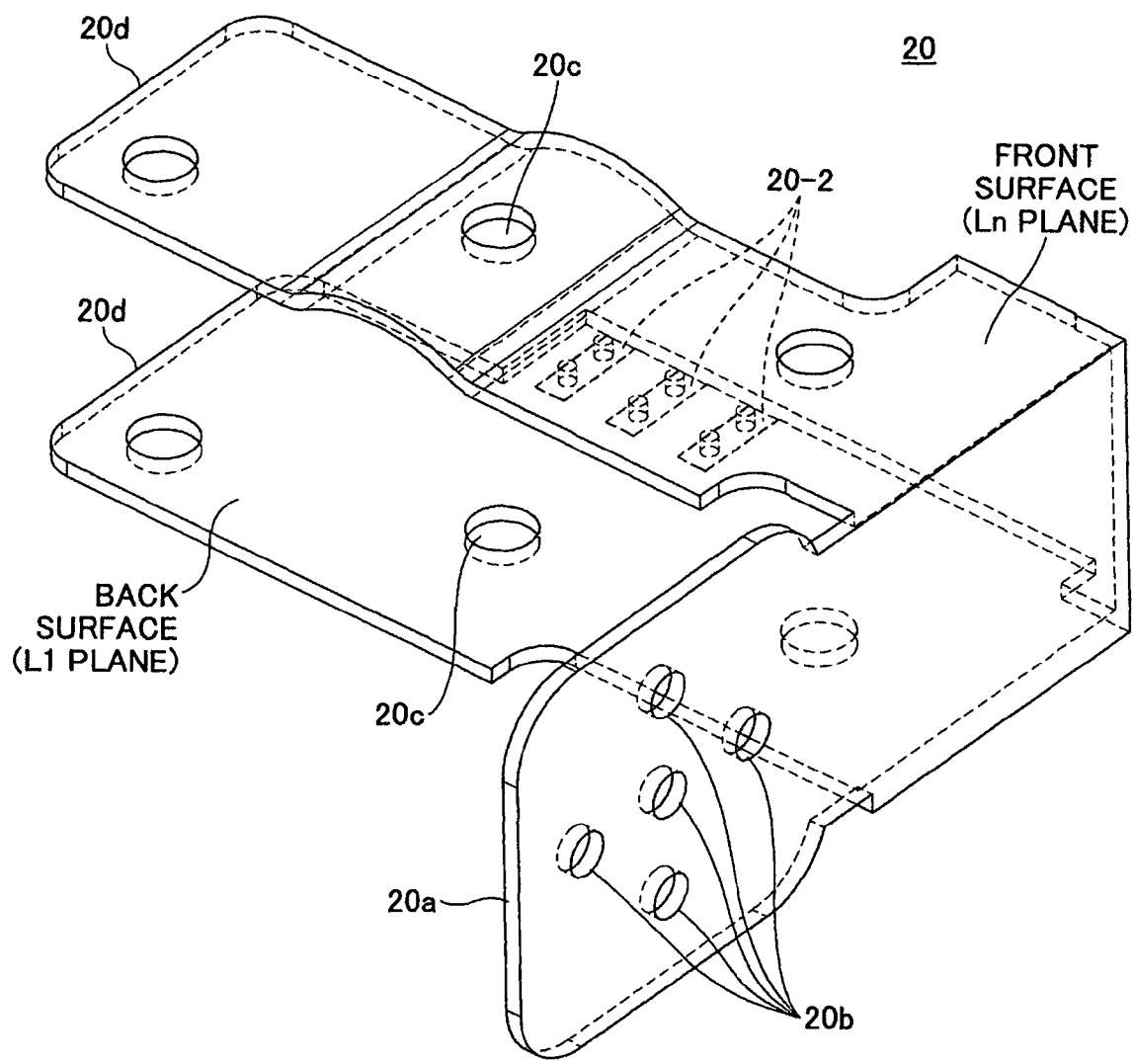
FIG. 4 is a perspective view of the FPC illustrated in FIG. 3.

A description will be given below of a structure of the FPC 20. FIG. 3 is an enlarged perspective view illustrating a state where the FPC 20 is attached to the single-fiber bidirectional optical transmission/reception device 4A. FIG. 4 is a perspective view illustrating the configuration of the FPC 20 alone. The FPC 20 is attached to the single-fiber bidirectional optical transmission/reception device 4A in a state where the FPC 20 is bent in a channel shape with a connection part 20a located in the middle thereof. The connection part 20a is provided with through holes 20b corresponding to the lead-terminals 8a extending from the PD stem part 8. The lead-terminals 8a are inserted into the respective through holes 20b of the connection part 20a. Ends of the lead-terminals 8a are joined by soldering to the wiring patterns of the FPC 20 in a state where the ends of the lead-terminals 8a protrude from the connection part 20a.

It should be noted that the FPC 20 illustrated in FIG. 3 is bent with a front surface (Ln plane) thereof being an outside, and the surface illustrated in FIG. 3 is the front surface (Ln plane). Therefore, the back surface (L1 plane) of the FPC 20 faces the single-fiber bidirectional optical transmission/reception device 4A. Although wiring patterns are formed on the front surface (Ln plane) and the back surface (L1 plane) of the FPC 20, illustration of the wiring patterns is omitted in FIGS. 3 and 4 for the sake of simplification of the drawings.

Figure 5:
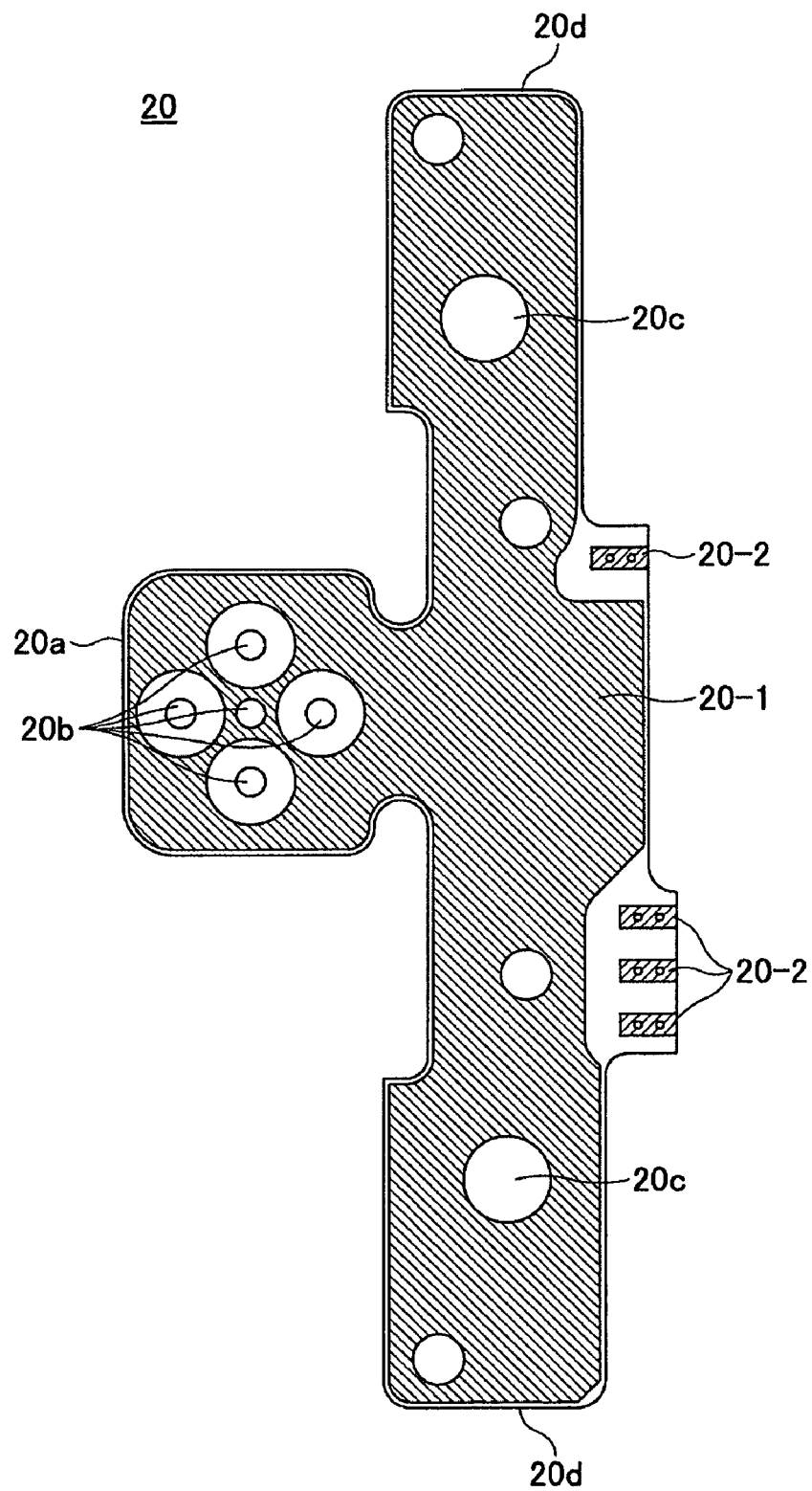
FIG. 5 is a view of a signal ground pattern formed on a surface (LD plane) when the FPC illustrated in FIG. 3 is developed.

FIG. 5 is a view illustrating a signal ground pattern formed on the front surface (Ln plane) when the FPC 20 is developed. The signal ground (SG) pattern 20-1 is formed as a solid pattern on almost the entire surface of the front surface (Ln plane) of the FPC 20. A hatched portion in FIG. 5 is the signal ground pattern 20-1. Lands 20-2 are formed as electrode terminals for connection with the circuit board 12A. Additionally, five through holes 20b are provided in the connection part 20a extending transversely from the center portion of the FPC 20. The through holes 20b are provided in correspondence to five lead-terminals 8a extending from the PD stem part 8 of the single-fiber bidirectional optical transmission/reception device 4A. Copper plating is applied to an inner surface of each through hole 20b so that a solder can easily flow from the front surface (Ln plane) to the back surface (L1 plane) by passing through the through holes 20b when joining the lead-terminals 8a to the wiring patterns on the front surface (L1 plane) by applying a solder onto the side of the front surface (Ln plane).

Moreover, through holes 20c are formed in connection parts 20d (second connection parts), each of which is formed by bending the FPC 20 at an angle of about 90 degrees with respect to the connection part 20a (first connection part). The signal ground pattern 20-1 and an outer surface of the LD stem part 10 are joined by soldering through the thorough holes 20d in a state where the FPC 20 is bent in a channel shape and sandwiches the LD stem part 10. Thereby, the housing of the single-fiber bidirectional optical transmission/reception device 4A is connected to the ground wiring of the circuit board 12A through the signal ground pattern 20-1.

Figure 6:
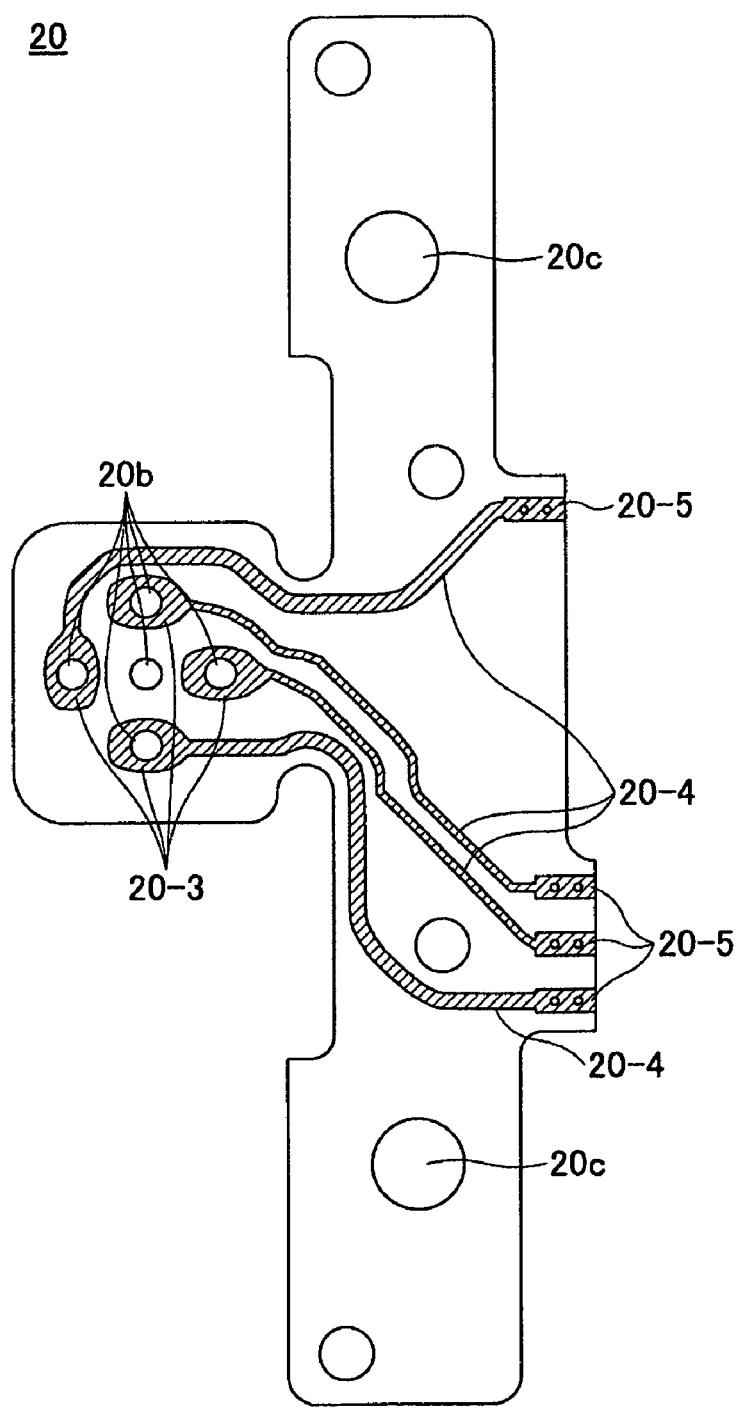
FIG. 6 is a view illustrating wiring patterns formed on a back surface (L1 plane) when the FPC illustrated in FIG. 3 is developed.

FIG. 6 is a view illustrating the wiring patterns formed on the back surface (L1 plane) when developing the FPC 20. FIG. 6 illustrates the wiring patterns formed on the back surface (L1 plane) of the FPC 20 in a state where the wiring patterns are viewed from the side of the front surface (Ln plane) through the FPC 20.

From among the five through holes 20b, the through hole 20b at the center is not provided with the wiring pattern. This is because the lead-terminal 8a inserted into the through hole 20b at the center is a lead-terminal for grounding and is joined by soldering to the ground pattern on the front surface (Ln plane). A solder joining part 20-3 is formed around each of the four through holes 20b arranged around the through hole 20b at the center. Each solder joining part 20-3 is connected to the respective land 20-5 by the respective wiring pattern 20-4. Each land 20-5 is formed at a position corresponding to the respective land 20-2 formed on the front surface (Ln plane) of the FPC 20. Each land 20-5 is connected to the corresponding land 20-2 by through holes. When soldering, melted solder flows through the through holes from the lands 20-2 on the front surface (Ln plane) to the lands 20-5 on the back surface (L1 plane). Accordingly, the lands 20-5 are joined to the corresponding electrode terminals on the circuit board 12A.

From among the through holes 20b formed in the connection part 20a of the FPC 20, the through hole 20b at the center is connected with the lead-terminal 8a for grounding as mentioned above. The four though holes 20b surrounding the through hole 20b at the center are connected to a lead-terminal for high-bias, a lead-terminal for a power supply preamplifier, a lead-terminal for output signals and a lead-terminal for power supply to the photo diode, respectively. The wiring patterns 20-4 connected to the four lead-terminals are formed as impedance-matched patterns in order to suppress reflection and transmission loss. In the present embodiment, microstriplines of a characteristic impedance of 50Ω are formed as the wiring patters 20-4. Because all of the wiring patterns 20-4 are formed in the FPC 20, the wiring patterns 20-4 can be easily formed as the impedance-matched patterns of 50Ω.

As mentioned above, in the present embodiment, the ground part of the reception side (photo diode) of the single-fiber bidirectional optical transmission/reception device 4A and the ground part of the transmission side (laser diode) of the single-fiber bidirectional optical transmission/reception device 4A are electrically connected to each other by the ground wiring pattern of the FPC 20. Thereby, the connection between the transmission side and the reception side is strengthened, which suppresses a cross-talk between the reception side circuit (photo diode) and the transmission side circuit (laser diode). Additionally, because the lead-terminals 8a extending from the PD stem part 8 are connected to the FPC 20, the lead-terminals 8a to which a noise can easily enter can be very short, which suppresses a noise entering the reception side circuit. Further, the power supply wiring and the output wiring of the photo diode through which a very small current flows are formed as impedance-matched patterns so as to suppress reflection of signals and transmission loss in the wirings of the reception side.

In the present embodiment, besides the noise suppressing structure mentioned above, a circuit associating with the laser diode in which a relatively large current flows suppresses an influence given to a circuit associating with the photo diode in which a very small current flows. That is, in the present embodiment, the circuit associating with the laser diode of the transmission side is provided on the front surface (Ln plane) of the circuit board 12A, and the circuit associating with the photo diode of the reception side is provided on the back surface (L1 plane) of the circuit board 12A.

Figure 7:
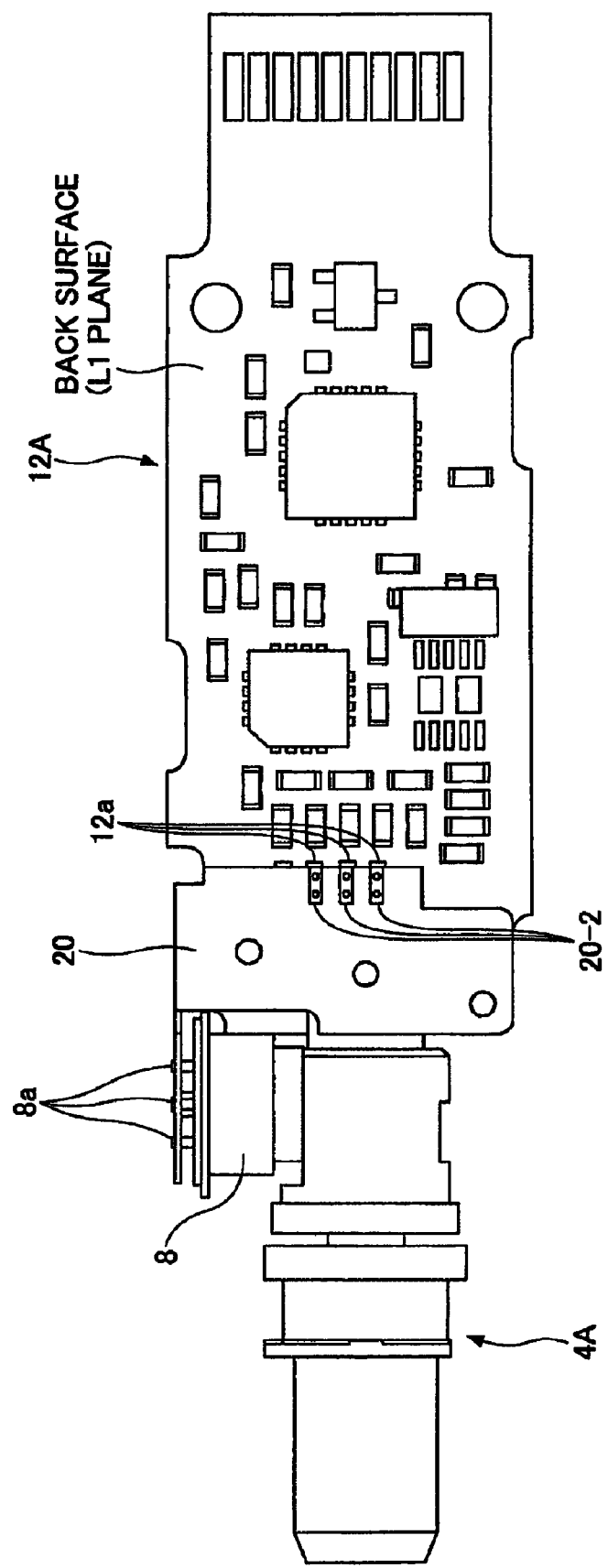
FIG. 7 is a plan view of a circuit board to which a single-fiber bidirectional optical transmission/reception device is connected through the FPC when viewed from the back surface (L1 plane) side.

FIG. 7 is a plan view of the back surface (L1 plane) of the circuit board 12A to which the single-fiber bidirectional optical transmission/reception device 4A is connected through the FPC 20. From among the lead-terminals 8a extending from the PD stem part 8 of the single-fiber bidirectional optical transmission/reception device 4A, the power supply terminal VDD for the preamplifier, the power supply terminal VPD for the photo diode, and the output terminal for the photo diode are connected to the electrode terminals 12a formed on the back surface (L1 surface) of the circuit board 12A by the impedance-matched patterns of 50Ω and the lands 20-5 formed in the FPC 20. Electronic parts associating with a drive circuit of the photo diode and a signal processing circuit are mounted on the back surface (L1 plane) of the circuit board 12A.

On the other hand, electronic parts associating with a drive circuit of the laser diode and a signal processing circuit are mounted on the front surface (Ln plane) of the circuit board 12A. The lead-terminals 10a extending from the LD stem part 10 of the single-fiber bidirectional optical transmission/reception device 4A are connected to the electrode terminals 12b formed on the front surface (Ln plane) of the circuit board 12A as the same as the example illustrated in FIG. 1. Because a relatively large current flows in the circuit associating with the laser diode, the circuit associating with the laser diode is not so weak to a noise as the circuit associating with the photo diode. Accordingly, the lead-terminals 10a extending from the LD stem part 10 are directly connected to the electrode terminals 12b of the circuit board 12A without using the flexible printed board (FPC) 20.

As mentioned above, the electronic parts associating with the drive circuit of the laser diode are mounted on the front surface (Ln plane) of the circuit board 12A, while the electronic parts associating with the drive circuit of the photo diode are mounted on the back surface (L1 plane) of the circuit board 12A. Accordingly, the circuit of the transmission side is formed on the Ln plane of the circuit board 12A, and the circuit of the reception side is formed on the L1 plane of the circuit board 12A, which results in the circuit of the transmission side and the circuit of the reception side being separated from each other. Thereby, a mutual influence between the circuit of the transmission side and the circuit of the reception side, especially, an influence given from the circuit of the transmission side to the circuit of the reception side is suppressed.

As mentioned above, in the present embodiment, the circuit of the transmission side is formed on the front surface (Ln plane) of the circuit board 12A, and the circuit of the reception side is formed on the back surface (L1 plane) of the circuit board 12A. Because a relatively large current flows in the circuit of the transmission side, the circuit of the transmission side and the circuit of the reception side are separated from each other so that a change in the current flowing in the circuit of the transmission side does not cause a noise appearing in the circuit of the reception side. Generally, the circuit board 12A is formed of a multilayer board. In the multilayer board, via holes are formed to interconnect the layers. Generally, such a via hole is formed by a through hole penetrating the circuit board and having a plated inner surface.

Figure 8:
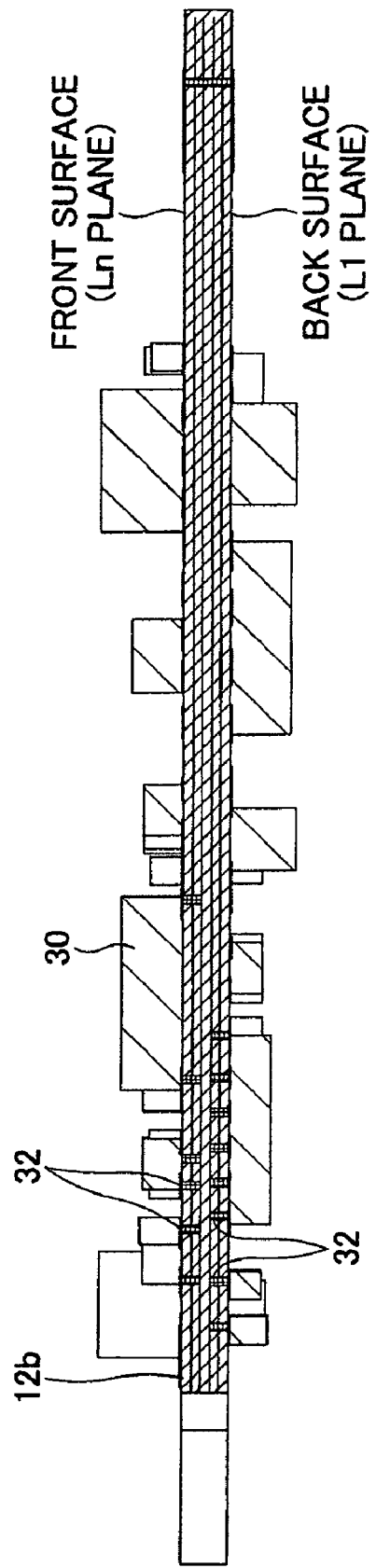
FIG. 8 is a cross-sectional view of the circuit board.

In the present embodiment, as a via hole formed in a part of the circuit board 12A, a through via hole, which extends from the front surface to the back surface of the circuit board 12A, is not used but a so-called inner via hole (IVH) is used. The inner via hole is a via hole extending to the middle of the circuit board 12A and plating is applied to an inner surface thereof. Especially, only the IVH is used and the through via hole is not used in a portion to which the lead-terminals 10a extending from the LD stem part 10 are connected FIG. 8 is a cross-sectional view of the circuit board 12A. An LD drive IC 30 for driving the laser diode is mounted on the front surface (Ln plane) of the circuit board 12A. A relatively large current is supplied to the laser diode in the single-fiber bidirectional optical transmission/reception device 4A through the electrode terminals 12b and the lead-terminals 10a. If a through via hole is formed in an area between the LD drive IC 30 and the electrode terminals 12b, a noise generated by changes in the laser diode drive current may enter the circuit formed on the back surface (L1 plane) of the circuit board 12A.

Thus, in the present embodiment, a through via hole is not used especially in the area between the LD drive IC 36 and the electrode terminals 12b, and interlayer connection is achieved by using only inner via holes (IVH) 32 so as to suppress an energy of a large amplitude oscillation from leaking from the transmission side of the front surface (Ln plane) to the reception side of the back surface (L1 plane) of the circuit board 12A.

Moreover, in the present embodiment, the housing of the single-fiber bidirectional optical transmission/reception device 4A is electrically divided into two portions so as to form a structure in which, even if an electrostatic discharge (ESD) occurs to the housing 2 of the single-fiber bidirectional optical transmitter/receiver, an influence of the ESD is not given to the circuit board 12A and the internal circuit of the single-fiber bidirectional optical transmission/reception device 4A.

FIG. 8 is an enlarged cross-sectional view of the single-fiber bidirectional optical transmission/reception device 4A. A connector housing 34 of a connector part 6 of the single-fiber bidirectional optical transmission/reception device 4A is electrically separated from a stem housing 36 in which the PD stem part 8 and the LD stem part 10 are formed. As illustrated in FIG. 2, the single-fiber bidirectional optical transmission/reception device 4A is fixed to the main housing 2 by a groove formed on an outer circumference of the connector part 6 being engaged with the connection part of the main housing 2. The connector housing 36 of the connector part 6 is formed of, for example, a metal (conductor) such as a stainless steel, and the main housing 2 and the connector housing 34 are at the same potential.

If the connector housing 34 of the connector part 6 and the stem housing 36 on the rear side of the connector 6 are integrated in one piece structure, the PD stem part 8 and the LD stem part 10 are electrically connected to the main housing 2. Thereby, the signal ground wiring of the circuit board 12A is also electrically connected to the main housing 2. With such a structure, if an electrostatic discharge (ESD) occurs in the main housing 2, a large discharge voltage is applied to the electronic circuits of the PD stem part 8 and the LD stem part 10 and the electronic parts of the circuit board 12A, which may give a damage to the electronic circuits and electronic parts.

Figure 9:
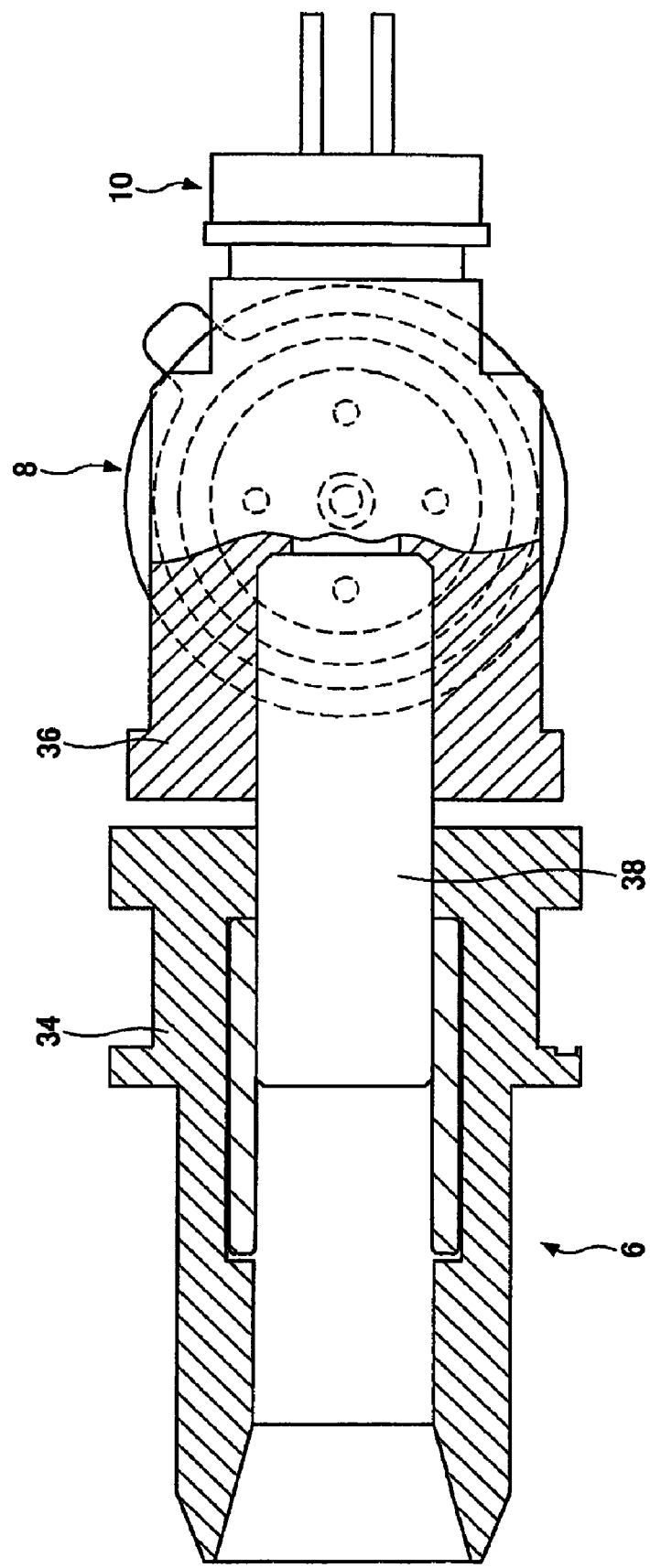
FIG. 9 is an enlarged cross-sectional view of the single-fiber bidirectional optical transmission/reception device.

Thus, in the present embodiment, the connector housing 34 of the connector part 6 of the single-fiber bidirectional optical transmission/reception device 4A is electrically separated from the stem housing 36 in which the PD stem part 8 and the LD stem part 10 are formed. That is, as illustrated in FIG. 9, the connector housing 34 and the stem housing 36 of the single-fiber bidirectional optical transmission/reception device 4A are formed as separate parts, and these parts are integrated with each other by connecting by a connection member 38 formed of an insulating material. The connection member 38 is formed of, for example, an insulating ceramic material such as zirconia or the like.

The stem housing 36 in which the PD stem part 8 and the LD stem part 10 are formed is connected to the circuit board 12A through the FPC 20 as illustrated in FIG. 2 and FIG. 3. That is, the FPC 20 is joined by soldering to the outer surface (stem housing 36) of the LD stem part 10 through the through holes 20c in a state where the FPC 20, which is bent in a channel shape, sandwiches the stem housing 36 of the LD stem part 10. Thereby, the stem housing 36 is electrically connected to the ground wiring of the circuit board 12A via the signal ground pattern 20-1 of the FPC 20. It should be noted that the circuit board 12A is fixed to the main housing 2 by screws, but the screw-fixing part is at a position of a base material of the circuit bard 12A and there is no electric connection at the screw-fixing part.

According to the above-mentioned structure, the stem housing 36 in which the PD stem part 8 and the LD stem part 10 are formed and the circuit board 12A are accommodated in the main housing 2 of the single-fiber bidirectional optical transmitter/receiver in the state where the stem housing 36 and the circuit board 12A are electrically separated from the main housing 2. Therefore, even if an electrostatic discharge (ESD) occurs in the main housing 2, there is no voltage applied to the stem housing 36 and the circuit board 12A due to the discharge, and the electronic circuits in the stem housing 36 and the electronic parts on the circuit board 12A are protected from an electrostatic discharge (ESD).

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A single-fiber bidirectional optical transmitter/receiver comprising:
   a single-fiber bidirectional optical transmission/reception device including a reception side and a transmission side;
   a circuit board having a signal processing circuit and a drive circuit configured to drive the single-fiber bidirectional optical transmission/reception device; and
   a main housing accommodating the single-fiber bidirectional optical transmission/reception device and the circuit board,
   wherein the reception side and the transmission side of the single-fiber bidirectional optical transmission/reception device are electrically separated from each other but a ground part of the reception side of the single-fiber bidirectional optical transmission/reception device is electrically connected to a ground part of the transmission side of the single-fiber bidirectional optical transmission/reception device through a ground wiring pattern formed on a flexible printed board.

2. The single-fiber bidirectional optical transmitter/receiver according to claim 1, wherein the ground wiring pattern is a solid wiring pattern formed on a surface of the flexible printed board.

3. The single-fiber bidirectional optical transmitter/receiver according to claim 1, wherein the flexible printed board has a first connection part opposite to a part where lead-terminals of the reception side are provided and a second connection part bent from the first connection part and contacting the ground part of the transmission side.

4. The single-fiber bidirectional optical transmitter/receiver according to claim 3, wherein through holes for terminal connection are provided in the first connection part of the flexible printed board, and the lead-terminals of the reception side are inserted into and joined to the through holes, respectively.

5. The single-fiber bidirectional optical transmitter/receiver according to claim 4, wherein the lead-terminal for grounding from among the lead-terminals of the reception side is connected to the ground wiring pattern formed on the flexible printed board, and the lead-terminals for signal output and power supply from among the lead-terminals on the reception side are connected to the circuit board through wiring patterns formed on a back surface of the flexible printed board.

6. The single-fiber bidirectional optical transmitter/receiver according to claim 5, wherein the wiring patterns formed on the back surface of the flexible printed board are impedance-matched wiring patterns.

7. The single-fiber bidirectional optical transmitter/receiver according to claim 6, wherein the impedance-matched wiring patterns are microstriplines of a characteristic impedance of 50 Ω.

8. The single-fiber bidirectional optical transmitter/receiver according to claim 1, wherein the single-fiber bidirectional optical-transmission/reception device includes a connector part receiving an optical fiber and a stem accommodating a photo diode of the reception side and a laser diode of the transmission side; a connector housing of the connector part and a stem housing of the stem part are electrically separated from each other; and the connector housing of the connector part is electrically connected to the main housing, and the stem housing and the circuit board are electrically separated from the main housing.

9. The single-fiber bidirectional optical transmitter/receiver according to claim 8, wherein the single-fiber bidirectional optical-transmission/reception device includes the connector housing, the stem housing, and an insulating member having one end engaging with the connector housing and the other end engaging the stem housing; and the connector housing and the stem housing are integrated with each other via the insulating member.

10. The single-fiber bidirectional optical transmitter/receiver according to claim 1, wherein the circuit board is a multi-layer board, the drive circuit and the signal processing circuit of the transmission side of the single-fiber bidirectional optical transmission/reception device are formed on a front surface of the circuit board;

the drive circuit and the signal processing circuit of the reception side of the single-fiber bidirectional optical transmission/reception device are formed on a back surface of the circuit board;

lead terminals of the transmission side of the single-fiber bidirectional optical transmission/reception device are connected to electrode terminals formed on the front surface of the circuit board;

a laser diode drive IC for driving a laser diode of the transmission side of the single-fiber bidirectional optical transmission/reception device is mounted on the front surface of the circuit board; and inner via holes for interlayer connection, which do not penetrate through the circuit board, are provided in a part of the circuit board between the electrode terminals connected to the lead-terminals of the transmission side and the laser diode drive IC.

* * * * *